(12) United States Patent
Hori

(10) Patent No.: US 6,953,727 B2
(45) Date of Patent: Oct. 11, 2005

(54) MANUFACTURE METHOD OF SEMICONDUCTOR DEVICE WITH GATE INSULATING FILMS OF DIFFERENT THICKNESS

(75) Inventor: Mitsuaki Hori, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/604,846

(22) Filed: Aug. 21, 2003

(65) Prior Publication Data

US 2004/0132253 A1 Jul. 8, 2004

(30) Foreign Application Priority Data

Aug. 28, 2002 (JP) ........................................ 2002-249205

(51) Int. Cl.[7] ........................................ H01L 21/8234
(52) U.S. Cl. ........................................ 438/275; 438/981
(58) Field of Search ........................................ 438/200, 275, 438/906, 910, 981

(56) References Cited

U.S. PATENT DOCUMENTS

| | | | | |
|---|---|---|---|---|
| 5,989,948 A | * | 11/1999 | Vines et al. | 438/275 |
| 6,171,911 B1 | * | 1/2001 | Yu | 438/275 |
| 6,258,673 B1 | * | 7/2001 | Houlihan et al. | 438/981 |
| 6,551,884 B2 | * | 4/2003 | Masuoka | 438/275 |
| 6,759,302 B1 | * | 7/2004 | Chen et al. | 438/275 |

FOREIGN PATENT DOCUMENTS

| | | |
|---|---|---|
| JP | 07-335661 | 12/1995 |
| JP | 08-321443 | 12/1996 |
| JP | 09-232325 | 9/1997 |
| JP | 2000-182574 | 6/2000 |

OTHER PUBLICATIONS

Notification of the First Office Action dated Jun. 10, 2005.

* cited by examiner

Primary Examiner—Chandra Chaudhari
(74) Attorney, Agent, or Firm—Westerman, Hattori, Daniels and Adrian LLP

(57) ABSTRACT

A method of manufacturing a semiconductor device, having the steps of: (a) forming a first gate insulating film having a first thickness in a plurality of regions on a surface of a semiconductor substrate; (b) removing the first gate insulating film in a first region among the plurality of regions and allowing a native oxide film to be formed; (c) heating the semiconductor substrate in a reducing atmosphere and selectively reducing and removing the native oxide film formed in the step (b); and (d) after the step (c), forming a second gate insulating film having a second thickness thinner than the first thickness on the surface of the semiconductor substrate in the first region.

11 Claims, 5 Drawing Sheets

MANUFACTURE METHOD OF SEMICONDUCTOR DEVICE WITH GATE INSULATING FILMS OF DIFFERENT THICKNESS

CROSS REFERENCE TO RELATED APPLICATION

This application is based on and claims priority of Japanese Patent Application No. 2002-249205 filed on Aug. 28, 2002, the whole contents of which are incorporated herein by reference.

FIELD OF THE INVENTION

The present invention relates to a semiconductor device manufacture method, and more particularly to a method of manufacturing a semiconductor device having gate insulating films of different types having different thicknesses.

DESCRIPTION OF THE RELATED ART

A gate insulating film plays an important role in an insulated gate type field effect transistor. If a gate insulating film is made of silicon oxide, the gate insulating film is formed by thermal oxidation in order to make a high quality silicon oxide film. It is known that the quality of a gate oxide film is not determined only by the film forming method, but influenced by crystallinity of a silicon substrate before oxidation.

The publication JP-A-8-321443 proposes annealing of silicon wafer for 1 hour at 1200° C. in a hydrogen atmosphere to improve the surface flatness of the silicon waver and improve a breakdown voltage of a very thin oxide film and a manufacture yield.

The publication JP-A-7-335661 proposes annealing at 1100° C. or lower in a reduced pressure hydrogen atmosphere at 700 torr or lower as a pre-process for forming a gate oxide film, to diffuse oxygen atoms in silicon lattices to an external and change crystal defects to highly perfect silicon crystal lattices. This publication teaches that annealing at 1200° C. or higher has a high possibility of generating slip lines which are one kind of crystal defects.

The publication JP-A-9-232325 proposes annealing for 1 to 60 seconds at 950° C. to 1200° C. in a hydrogen-containing atmosphere immediately before a gate oxide film is formed, to diffuse impurity oxygen atoms to an external.

In a semiconductor device having logic circuits, logic-memory mixed circuits or the like, different supply voltages are used in some cases for an input/output circuit and an internal circuit. In such cases, the thicknesses of gate insulating films are made different in accordance with applied voltages.

Also in an internal circuit, in some cases the thicknesses of gate insulating films are made different in accordance with the objectives of transistors used. It is proposed that the gate insulating film of a transistor for a high speed operation is made thin, and that the gate insulating film of a transistor for a low power dissipation is made relatively thick.

FIGS. 5A to 5F are schematic cross sectional views of a substrate illustrating a method of manufacturing a semiconductor device having gate insulating films of two types having different thicknesses.

As shown in FIG. 5A, in the surface layer of a silicon substrate 50, an element separation trench is formed. An insulating film of silicon oxide or the like is deposited on the substrate. The insulating film deposited on the surface other than the trench surface is removed by chemical mechanical polishing (CMP) or the like to form a shallow trench isolation (STI) 51.

As shown in FIG. 5B, the surface of the silicon substrate 50 is thermally oxidized to form a gate insulating film 52 having a first thickness on the surface of an active region surrounded by STI 51. The gate insulating film 52 having the first thickness is relatively thick among gate insulating films having different thicknesses.

As shown in FIG. 5C, a resist layer is formed on the substrate surface and an opening is formed therethrough to expose the active region in which a relatively thin gate insulating film is to be formed. By using this resist pattern 54 as a mask, the exposed gate insulating film 52 having the first thickness is removed by hydrofluoric acid aqueous solution or the like. The gate insulating film 52 covered with the resist pattern 54 is left as it is.

As shown in FIG. 5D, in the oxide film removing process and a following chemical process, a native oxide film 58 is formed on the silicon surface which is in contact with chemicals 57.

In this specification, the "native oxide film" is intended to mean a low density silicon oxide film formed on the surface of a silicon substrate exposed in air or the like and a low density silicon oxide film formed on a silicon surface by a chemical process or the like. The native oxide film has a more imperfect crystallinity and a lower density than a high quality oxide film formed by thermal oxidation or the like.

As shown in FIG. 5E, if necessary, the native oxide film 58 is removed by processing the substrate surface with hydrofluoric acid aqueous solution 59. Since the native oxide film is readily dissolved in hydrofluoric acid aqueous solution, the native oxide film can be etched by hardly thinning the previously formed gate insulating film 52.

As shown in FIG. 5F, the surface of the exposed silicon substrate 50 is thermally oxidized to form a gate oxide film 61 having a second thickness thinner than the first thickness. During this thermal oxidation process, the first gate oxide film 52 having the first thickness is slightly thickened. In this manner, gate insulating films having two different thicknesses are formed.

If a thin gate oxide film is formed without removing the native oxide film shown in FIG. 5E, the gate oxide film includes the native oxide film. Since the native oxide film is a thin film, if the gate insulating film to be formed thereafter is sufficiently thicker than the native oxide film, the influence of the native oxide film upon the gate insulating film is small. However, it has been requested recently to thin also the gate insulating film, and typically a gate insulating film of 1.5 nm in thickness is requested.

If the thickness of a native oxide film is 1 nm and a gate oxide film is 1.5 nm, the influence of the native oxide film upon the gate insulating film is large. If the gate insulating film is formed directly on the surface of the native oxide film, the quality of the gate insulating film is considerably degraded by the native oxide film.

If the native oxide film is removed with hydrofluoric acid aqueous solution as shown in FIG. 5E, the influence of the native oxide film can be mitigated. However, if the substrate is exposed in atmospheric air after washing and before forming an insulating film, new oxidation occurs. It is necessary to manage the time period after washing and before film forming. If the standby time changes, a variation in film thicknesses of final gate insulating films becomes large.

The hydrofluoric acid aqueous solution process of removing a native oxide film may form a pin hole 60 in the gate oxide film 52 as shown in FIG. 5(E) if there is a defect in the gate oxide film. As the pin hole 60 is formed, the characteristics of an insulated gate type transistor formed in the region of the pin hole are considerably degraded.

As described above, it is not easy to manufacture a semiconductor device having gate insulating films of two or more types having different thicknesses, while achieving high reliability, high performance and high stability.

SUMMARY OF THE INVENTION

An object of this invention is to provide a semiconductor manufacture method capable of manufacturing a semiconductor device having gate insulating films of difference thicknesses, with high reliability.

Another object of this invention is to provide a manufacture method capable of forming gate insulating films of a plurality of types having different thicknesses and realizing a high quality and sufficient gate breakdown voltage even for a relatively thin gate insulating film.

Still another object of this invention is to provide a semiconductor manufacture method capable of removing a portion of a gate insulating film having a first thickness once formed on an active region, and forming on the active region a second gate insulating film of high quality having a second thickness thinner than the first thickness.

According to one aspect of the present invention, there is provided a method of manufacturing a semiconductor device, having the steps of: (a) forming a first gate insulating film having a first thickness in a plurality of regions on a surface of a semiconductor substrate; (b) removing the first gate insulating film in a first region among the plurality of regions and allowing a native oxide film to be formed; (c) heating the semiconductor substrate in a reducing atmosphere and selectively reducing and removing the native oxide film formed in the step (b); and (d) after the step (c), forming a second gate insulating film having a second thickness thinner than the first thickness on the surface of the semiconductor substrate in the first region.

As above, gate insulating films of two or more types having different thicknesses can be formed while realizing high stability, reliability and performance.

DESCRIPTION OF THE PREFERRED EMBODIMENTS

Figure 1A:
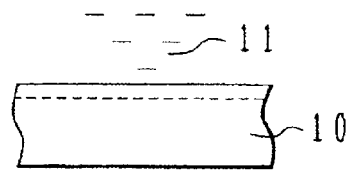
FIGS. 1A to 1E are schematic cross sectional views and graphs explaining the experiments made by the inventor.

As shown in FIG. 1A, processing the surface of a silicon substrate 10 with chemicals 11 is required in various situations. For example, chemicals 11 include: a mixture solution (SPM) of sulfuric acid and hydrogen peroxide to be used for resist layer removal and metal contamination removal; a mixture solution (SC1) of ammonium and hydrogen peroxide to be used for particle removal and the like; a mixture solution (SC2) of hydrochloric acid, hydrogen peroxide and water to be used for metal removal; and hydrofluoric acid aqueous solution (HF) to be used for oxide film removal; and the like.

Generally, plural kinds of the chemical processes among SPM, SC1 and SC2 processes are performed by exchanging the order of the processes in accordance with the process object. Such chemical processes form a native oxide film having a low density and a low crystallinity on the surface of a silicon substrate.

Figure 1B:
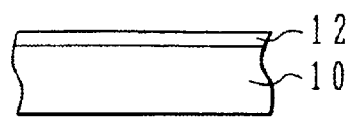
Figure 1C:
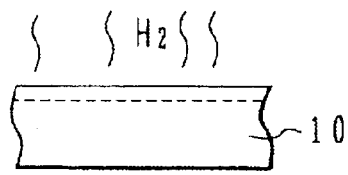

As shown in FIGS. 1B and 1C, in order to remove a native oxide film 12 on the surface of the silicon substrate 10, it is effective to perform a heat treatment in a hydrogen atmosphere.

The present inventor checked how the thicknesses of native oxide films change if they are formed by chemical processes and thereafter by performing heat treatments for 10 seconds at 1000° C. in a reduced hydrogen atmosphere at 20 torr. For the comparison, thermal oxidation films having a thickness of 1 nm were formed and a similar hydrogen atmosphere heat treatment was performed.

The film thickness measurements were all conducted in air by using a single wavelength ellipsometer. It is therefore inevitable that a native film is formed when a silicon substrate contacts air.

Figure 1D:
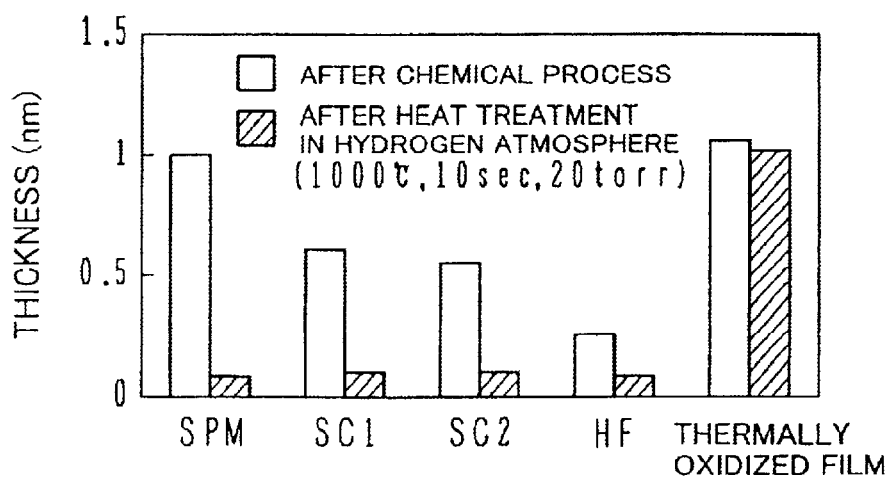

FIG. 1D is a graph showing the measurement results. In FIG. 1D, an outline bar chart shows the thickness of an oxide film formed initially. The native oxide film after an SPM chemical process had a thickness of about 1 nm. The thermally oxidized film was grown to have also a thickness of about 1 nm. The native oxide film after an SC1 chemical process had a thickness of about 0.6 nm. The native oxide film after an SC2 chemical process had a thickness of about 0.55 nm. The native oxide film after an HF chemical process had a thickness of about 0.25 nm.

If a silicon substrate is exposed in air, a native oxide film grows on the surface thereof. If the semiconductor substrate subjected to any of the above-described chemical process is exposed in air, a native oxide film is formed during the exposure in air with a high possibility as well as a native oxide film is formed during the chemical process.

The hatched bar chart shown on the right side of each outline bar chart shows the thickness of an oxide film after heat treatment in a hydrogen atmosphere. The native oxide film after the SPM process and after heat treatment in a hydrogen atmosphere had a thickness of about 0.1 nm. The native oxide film after the SC1 or SC2 process and after heat treatment in a hydrogen atmosphere reduced its thickness to a degree similar to the native oxide film after SPM process. The native oxide film after the HF process was as thin as about 0.25 nm, and the native oxide film after heat treatment in a hydrogen atmosphere was slightly thinner than the other native oxide films.

It has been found that if the native oxide film after the chemical process is subjected to heat treatment in a hydrogen atmosphere, substantial thickness of the native oxide film is removed. Although there is a native oxide film about 0.1 nm thick even after heat treatment in a hydrogen atmosphere, it cannot be judged whether this native oxide film was formed by the chemical process or newly formed by the exposure in air. If the latter case is true, the native oxide film is almost perfectly removed. However, there is a possibility of the former case. In the following description, the analysis is made assuming that the former case is true.

Although the silicon oxide film having a thickness of about 1 nm formed by thermal oxidation reduced its thickness by about 0.05 nm through heat treatment in a hydrogen atmosphere, almost all of the thickness was left without being removed. It can be understood that heat treatment in a hydrogen atmosphere is selective etching relative to the native oxide film.

An etch amount of the native oxide film formed by the HF chemical process is about 0.15 nm through heat treatment in a hydrogen atmosphere, and the etch amount of the thermally oxidized film is about 0.05 nm, which is about 1/3 of 0.15 nm or 1/2 or smaller at the most. An etch amount of the native oxide film formed by the SC1 or SC2 chemical process is about 0.5 nm through heat treatment in a hydrogen atmosphere, and the etch amount of the thermally oxidized film is about 0.05 nm, which is about 1/10 of 0.5 nm or 1/8 or smaller at the most. An etch amount of the native oxide film formed by the SPM chemical process is about 0.9 nm through heat treatment in a hydrogen atmosphere, and the etch amount of the thermally oxidized film is about 0.05 nm, which is about 1/18 of 0.9 nm or 1/16 or smaller at the most.

It can be understood from the results shown in FIG. 1D that heat treatment in a hydrogen atmosphere is an effective process for selectively removing the native oxide film and leaving the thermally oxidized film as it was. If the SPM chemical process is used for removing resist and thereafter the SC1 or SC2 chemical process is performed among other processes, the heat treatment in the hydrogen atmosphere can almost perfectly remove the native oxide film formed by the chemical process and suppress an etch amount of the thermally oxidized film to 1/8 or smaller.

How the effects of the heat treatment in the hydrogen atmosphere change with a temperature was studied.

Figure 1E:
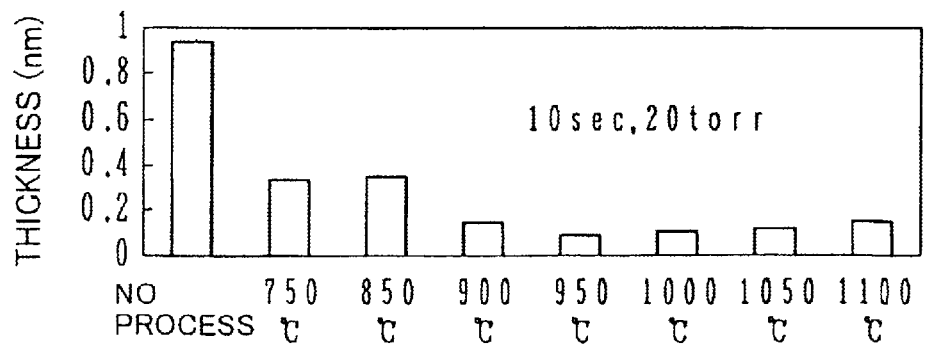

FIG. 1E is a graph showing the measurement results of the thicknesses of native oxide films formed by the SPM chemical process and remained after heat treatment in a hydrogen atmosphere at various temperatures. The heat treatment was performed under the conditions of a fixed hydrogen atmosphere pressure of 20 torr and a fixed heat treatment time of 10 seconds. The thickness of a native oxide film initially formed is about 1 nm.

The heat treatment temperature was changed in the range from 750° C. to 1100° C. As the temperature is raised starting from 750° C., the remaining thickness of the native oxide film is greatly reduced at 900° C., similar tendency being maintained up to 1050° C. As the temperature is raised to 1100° C., the remaining thickness of the native oxide film increases. It can be understood from these results that the heat treatment temperature in the hydrogen atmosphere is set preferably to about 900° C. to 1050° C.

It can be considered that the surface of a silicon substrate subjected to heat treatment in a hydrogen atmosphere is hard to be oxidized in atmospheric air because of hydrogen termination of dangling bonds. The influence of long time exposure in air upon native oxide films was studied.

Figure 2A:
FIGS. 2A to 2D are schematic cross sectional views and graphs explaining the experiments made by the inventor.

As shown in FIG. 2A, a silicon substrate 10 formed with a native oxide film 12 was exposed in atmospheric air and a change in the thickness of the oxide film was checked. Heat treatment in a hydrogen atmosphere was performed for 10 seconds, at 1000° C. and at a hydrogen atmosphere of 20 torr.

Figure 2B:
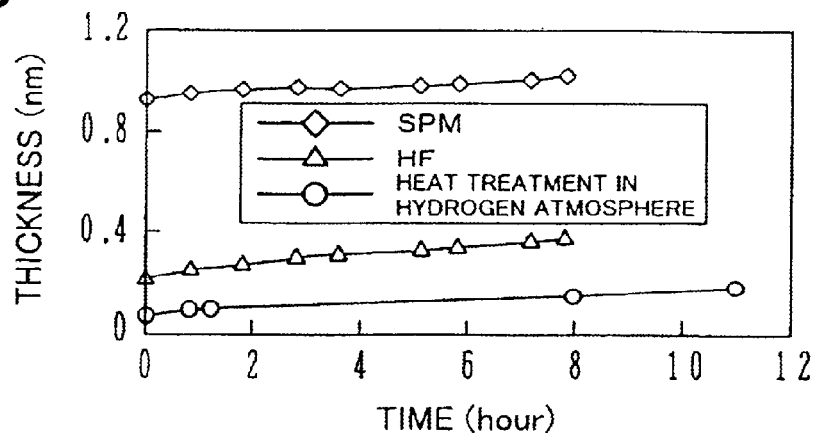

FIG. 2B is a graph showing a change in the thicknesses of oxide films. The ordinate represents a thickness of an oxide film in the unit of nm and the abscissa represents a time in atmospheric air exposure in the unit of hour.

The oxide film on the substrate surface subjected to the SPM process is initially as thick as about 1 nm. As the substrate is exposed in atmospheric air, the thickness of the oxide film increases although its increase is slow. The oxide film on the substrate surface subjected to the HF process is initially about 0.25 nm and the thickness increases as the time lapses. Although the HF process has a function of terminating dangling bonds on the substrate surface with hydrogen, it can be considered that oxidation resistance is likely to be broken.

The oxide film on the substrate surface subjected to heat treatment in a hydrogen atmosphere is initially about 0.1 nm and the increase in the thickness is very small even if the substrate is exposed in atmospheric air for a long time. This can be ascribed to that dangling bonds on the substrate surface are terminated with hydrogen and the state hardly to be oxidized by oxygen in atmospheric air is maintained. An increase in the thickness of the oxide film is very gentle as compared to the substrate surface subjected to the HF process.

Figure 5A:
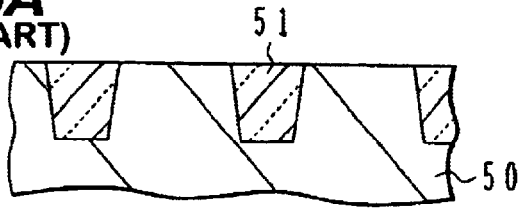
FIGS. 5A to 5F are cross sectional views of a substrate illustrating a method of manufacturing a semiconductor device according to prior art.
Figure 5B:
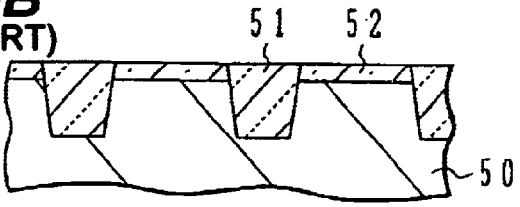
Figure 5C:
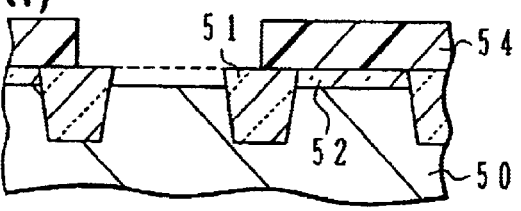
Figure 5D:
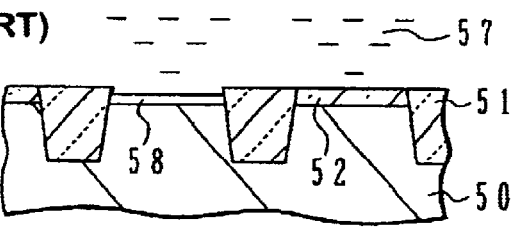
Figure 5E:
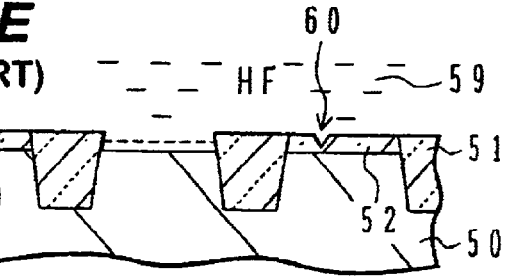
Figure 5F:
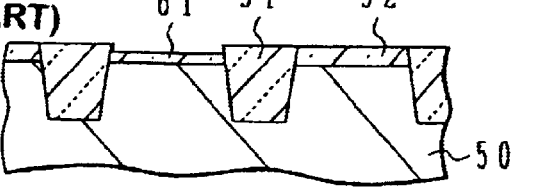

A relatively thick gate insulating film having a thickness of about 7 nm was formed on a substrate surface by water vapor oxidation at 800° C., and this gate insulating film in a region where a relatively thin gate insulating film is to be formed was removed (corresponding to FIGS. 5A to 5D). Next, heat treatment in a hydrogen atmosphere was performed to form a relatively thin gate insulating film having a thickness of about 1.2 nm. Thereafter, gate electrodes were formed and the influence of the heat treatment in the hydrogen atmosphere for forming the relatively thin gate insulating film was studied. For the comparison, measurements were made for the case that the native oxide film removing process is not performed and for the case that the HF process is performed (corresponding to FIG. 5E).

Figure 2C:
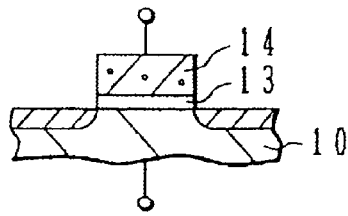

FIG. 2C is a schematic diagram showing the structure of a sample. A relatively thick gate insulating film 13 is formed on a silicon substrate 10 and a gate electrode 14 is formed on the gate insulating film 13.

Figure 2D:
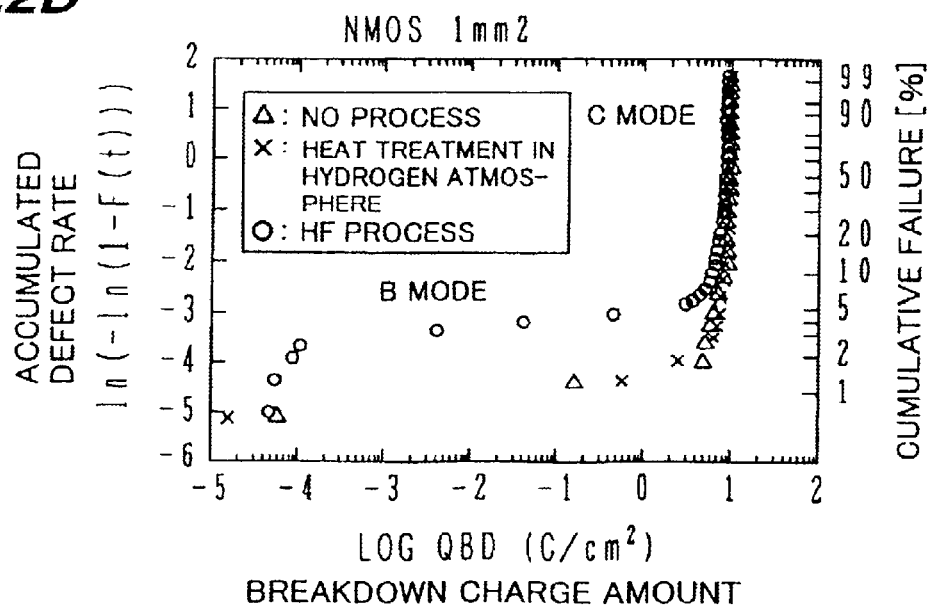

FIG. 2D is a graph showing the measurement results. The abscissa represents a logarithm of an amount QBD of charges which has flowed until the occurrence of breakdown and the ordinate represents an accumulated defect rate. Samples subjected to the HF process have many B-mode defects which occur in the small charge amount QBD region. Samples subjected to heat treatment in a hydrogen atmosphere have a B-mode defect rate similar to that of the samples without a process. It can be understood from these results that although B-mode defects are apt to occur if the HF process is performed, the relatively thick gate insulating film is not adversely affected if the heat treatment in a hydrogen atmosphere is performed.

It is therefore possible to remove an oxide film in the region where a thin gate insulating film is to be formed, without degrading the reliability of a semiconductor device, and to form a thin gate insulating film with high controllability. A native oxide film formed during a chemical process, exposure in atmospheric air and the like is removed by heat treatment in a hydrogen atmosphere. It is therefore possible to maintain constant the substrate state before oxidation and to form a stable thin gate insulating film. The thickness of a native oxide film can be neglected and the process time management from washing to insulating film forming can be alleviated.

Figure 3A:
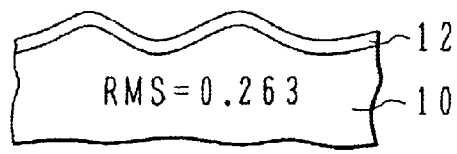
FIGS. 3A to 3D are schematic cross sectional views and a graph explaining the experiments made by the inventor.
Figure 3B:
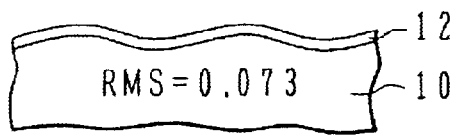

As shown in FIGS. 3A and 3B, the flatness of a silicon substrate was observed with an atomic force microscope (AFM) before and after heat treatment in a hydrogen atmosphere. FIG. 3A is a schematic diagram showing the substrate surface before heat treatment in a hydrogen atmosphere. RMS indicating the flatness was about 0.263 nm.

FIG. 3B is a schematic diagram showing the substrate surface after heat treatment in a hydrogen atmosphere. RMS indicating the flatness was about 0.073 nm. It can be understood that RMS indicating the flatness is lowered by $1/3$ or more by the heat treatment in the hydrogen atmosphere. Namely, after the heat treatment in the hydrogen atmosphere planarizes the substrate surface greatly.

After a thick gate insulating film was once formed, a portion thereof was removed. A thin gate insulating film, a gate electrode and source/drain regions were formed for both cases with and without the heat treatment in the hydrogen atmosphere, and the characteristics of the transistors were checked.

Figure 3C:
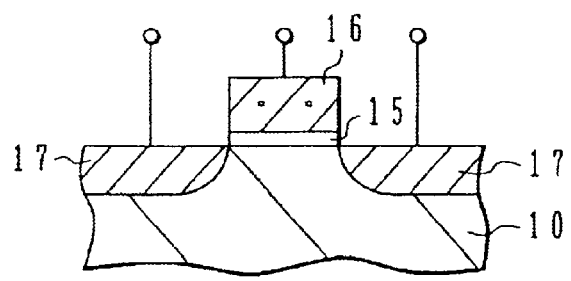

As shown in FIG. 3C, a thin gate insulating film 15 is formed on the surface of a silicon substrate 10 and a gate electrode 16 of polysilicon is formed on the thin gate insulating film 15. Source/drain regions 17 are formed on both sides of the gate electrode. After forming such transistors, transconductances were measured.

Figure 3D:
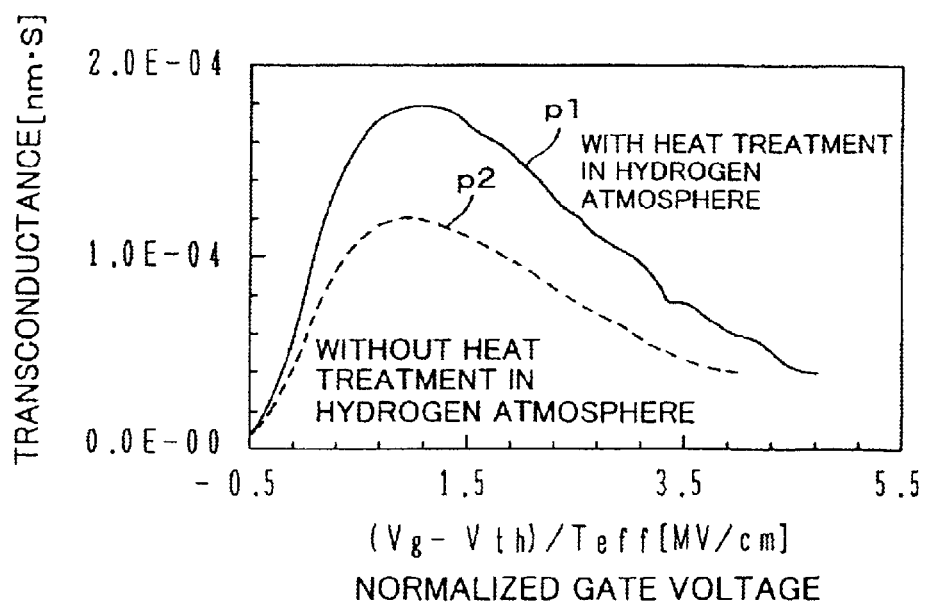

FIG. 3D is a graph showing measurement results. The ordinate represents a transconductance in the unit of nmAS and the abscissa represents an effective gate voltage normalized by a film thickness, in the unit of MV/cm. A solid line p1 shows the characteristics when heat treatment in a hydrogen atmosphere is performed, and a broken line p2 shows the characteristics when heat treatment in a hydrogen atmosphere is not performed. It can be seen that the transconductance increases considerably if the heat treatment in a hydrogen atmosphere is preformed. Namely, a sample subjected to the heat treatment in a hydrogen atmosphere has a larger drain current change relative to a unit change or constant change in the gate voltage. The transconductance increases by 40% at a maximum.

It can be understood from the above-described experiment results that the characteristics of a transistor can be improved by performing heat treatment in a hydrogen atmosphere when a portion of a gate insulating film is once removed and a thin film insulating film is formed in order to form gate insulating films having different thicknesses.

In the above-described experiments, although the heat treatment in the hydrogen atmosphere was performed by lamp annealing, it may be performed in a furnace. If an annealing process is performed in a furnace, it is perhaps necessary to use a longer heat treatment time. The pressure in a hydrogen atmosphere is preferably set to 100 torr or lower. A heat treatment temperature is relatively low, 1050° C. or lower and the heat treatment time may be short, about 10 seconds in the case of lamp annealing. The heat treatment time is relatively short also in the case of furnace annealing. It can therefore be expected that the problem that heat treatment in a hydrogen atmosphere changes an impurity profile in a silicon substrate hardly occurs.

An embodiment of a method of manufacturing a semiconductor device taking the above-described experiment results into consideration will be described.

Figure 4A:
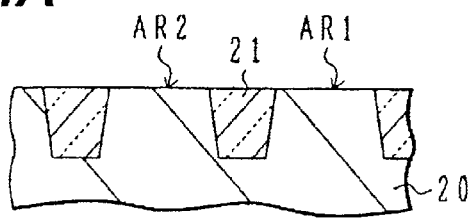
FIGS. 4A to 4H are cross sectional views of a substrate illustrating a method of manufacturing a semiconductor device according to an embodiment of the invention.

As shown in FIG. 4A, on the surface of a silicon substrate 20, an element separation trench is formed and silicon oxide or the like is buried in the trench to form an STI element separation region 21. The element separation region 21 defines active regions AR1 and AR2.

Figure 4B:
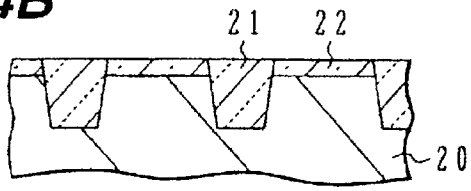

As shown in FIG. 4B, a relatively thick gate insulating film 22 having a thickness of about 7 nm is formed on the surface of the substrate 20 by water vapor (wet) oxidation at 800° C.

Figure 4C:
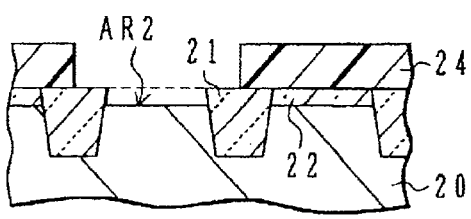

As shown in FIG. 4C, a resist layer is formed on the substrate surface, exposed and developed to form a resist pattern 24 having an opening corresponding to the active region AR2. By using the resist pattern 24 as a mask, the oxide film 22 on the active region AR2 is removed by hydrofluoric acid aqueous solution.

Figure 4D:
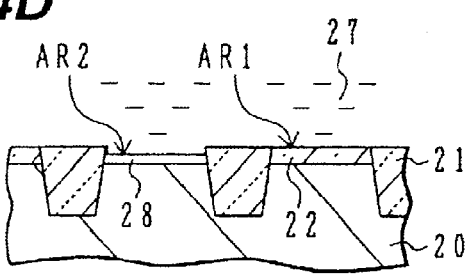

As shown in FIG. 4D, the resist pattern 24 is removed by chemicals 27. Resist removing chemicals are, for example, SPM. A chemical process such as an SC1 chemical process and an SC2 chemical process is further performed. The chemicals 27 form a native oxide film 28 on the surface of the active region AR2.

Figure 4E:
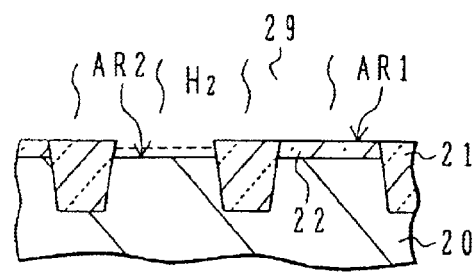

As shown in FIG. 4E, the substrate 20 is subjected to heat treatment for 10 seconds at 1000° C. in an atmosphere 29 of hydrogen gas 100% at 20 torr. This hydrogen atmosphere 29 removes the native oxide film 28 on the active region AR2. In this case, the thickness of the gate insulating film 22 is reduced by only 0.05 nm at the most, and almost the whole thickness of the native oxide film on the active region AR2 is removed. Even if a portion of the native oxide film is left, its thickness is only about 0.1 nm at the most.

Even if a portion of the native oxide film is left, the etch rate relative to the thermally oxidized film is $1/2$ or smaller, $1/8$ or smaller for a process different from the HF process, and $1/16$ or smaller for the SPM process.

Figure 4F:
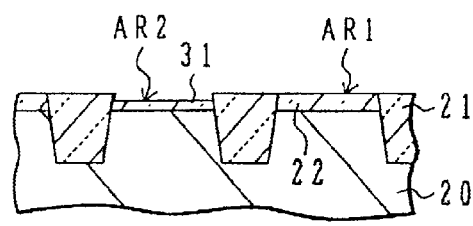

As shown in FIG. 4F, a relatively thin gate insulating film 31 is formed in a dry oxygen atmosphere in the same processing chamber as that used for the heat treatment in the hydrogen atmosphere or in a processing chamber capable of transporting a substrate without breaking a vacuum state. After the silicon oxide film is formed by the dry thermal oxidation, a nitridation process is performed in a nitrizing gas atmosphere such as $N_2O$ and NO.

The introduced nitrogen migrates the silicon oxide film 31 so that a silicon oxynitride film or silicon nitride film is formed near at the interface with the substrate 20. In this manner, the relatively thin gate insulating film having a thickness of about 1.2 nm is formed on the active region AR2. Nitrogen is introduced into the relatively thin gate insulating film in order to suppress the influence of impurities in the gate electrode. However, other countermeasures may be adopted to omit the nitrogen introducing process.

Figure 4G:
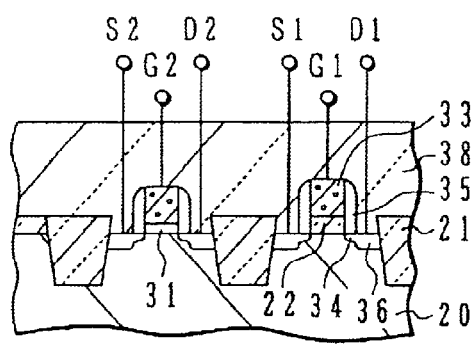

As shown in FIG. 4G, a polysilicon layer is formed to a thickness of about 150 nm and patterned to form gate electrodes having desired gate widths. By using the gate electrodes as a mask, ions are implanted for extension regions 34. After side wall spacers are formed, impurity ions are implanted again to form high impurity concentration source/drain regions 36. Thereafter, the gate electrodes are covered with an interlayer insulating film 38. Lead electrodes G, S and D are formed for the gate, source and drain.

In this manner, a semiconductor device can be manufactured which has two types of gate insulating films having different thicknesses.

Figure 4H:
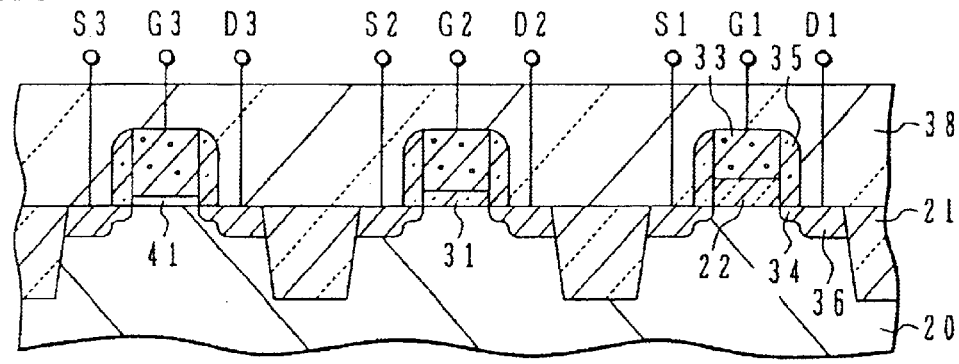

In the above description, the semiconductor device having two types of gate insulating films having different thicknesses is formed. A semiconductor device having three types of gate insulating films may also be formed. In this case, a thickest gate insulating film and a second thickest gate insulating film are formed by the processes shown in FIGS. 4A to 4F, and a remaining gate insulating film is formed by repeating the processes shown in FIGS. 4C to 4F. After three types of gate insulating films are formed, gate electrodes, extension regions, side wall oxide films, source/drain regions and an interlayer insulating film is formed to obtain the structure shown in FIG. 4H.

Although the resist removing process and sequential chemical process for the surface treatment are performed in the process of removing a portion of the gate insulating film, adverse effects of the chemical process can be prevented by performing the heat treatment in a hydrogen atmosphere after the chemical process. The heat treatment in the hydrogen atmosphere planarizes the substrate surface and improves the gate breakdown voltage.

As the chemical processes, SPM, SC1, SC2 and HF have been described. A process using ozonized water may also be performed with similar advantages described above.

Prior to forming an initial gate insulating film, heat treatment in a hydrogen atmosphere may be performed. The conditions of heat treatment in a hydrogen atmosphere may be selected as desired unless the left gate insulating film is adversely affected. Instead of a hydrogen atmosphere, an atmosphere which contains hydrogen may also be used. For example, an atmosphere of hydrogen diluted with gas such as nitrogen and argon may be used.

Although the thin gate insulating film is formed after the heat treatment in a hydrogen atmosphere, the oxide film after the heat treatment in a hydrogen atmosphere is very stable relative to time as shown in FIG. 2B. It can therefore be possible to perform later processes after the gate insulating film is exposed to atmospheric air. Although the thinnest gate insulating film is made of a silicon oxynitride film, the distribution of nitrogen in the silicon oxynitride film can be selected in various ways. A method of introducing nitrogen can also be selected in various ways.

The thinnest gate insulating film is formed by forming a silicon oxide film through thermal oxidation and introducing nitrogen into this silicon oxide film. Instead, a silicon oxide film formed by plasma oxidation or radical oxidation may also be used. A silicon oxide film not containing nitrogen may also be used.

A film having a high dielectric constant made of high di-electric (high k) material may be used as the gate insulating film or as a portion thereof. Two or more elements having gate insulating films of different thicknesses may be formed in the same active region.

The present invention has been described in connection with the preferred embodiments. The invention is not limited only to the above embodiments. It is apparent that various modifications, improvements, combinations, and the like can be made by those skilled in the art.

What is claimed is:

1. A method of manufacturing a semiconductor device, comprising steps of:
   (a) forming a first gate insulating film having a first thickness in a plurality of regions on a surface of a semiconductor substrate;
   (b) removing the first gate insulating film in a first region among the plurality of regions and allowing a native oxide film to be formed;
   (c) heating the semiconductor substrate in a reducing atmosphere and selectively reducing and removing the native oxide film formed in said step (b) to a thickness of 0.1 nm or less; and
   (d) after said step (c), forming a second gate insulating film having a second thickness thinner than the first thickness on the surface of the semiconductor substrate in the first region.

2. A method according to claim 1, further comprising steps of:
   (e) after said step (d), removing the first gate insulating film or the second gate insulating film in a second region of the plurality of regions and allowing a native oxide film to be formed;
   (f) after said step (e), heating the semiconductor substrate in a reducing atmosphere and selectively reducing and removing the native oxide film formed in said step (e); and
   (g) forming a third gate insulating film having a third thickness thinner than the first and second thicknesses on the surface of the semiconductor substrate in the second region of the plurality of regions.

3. A method according to claim 1, wherein the selective reducing and removing in said step (C) is performed by maintaining an etch rate of the gate insulating films at ½ or smaller, compared to that of the native oxide film.

4. A method according to claim 1, wherein the selective reducing and removing in said step (C) is performed by maintaining an etch rate of the gate insulating films at ⅛ or smaller, compared to that of the native oxide film.

5. A method according to claim 1, wherein the reducing atmosphere in said step (C) is a hydrogen atmosphere or a mixed gas atmosphere containing hydrogen.

6. A method according to claim 1, wherein a pressure of the reducing atmosphere in said step (C) is 100 torr or smaller and a temperature of heating in said step (C) is in a range from 900° C. to 1050° C.

7. A method according to claim 1, wherein after the selective reducing and removing of the native oxide film in said step (C), the second gate insulating film is formed in said step (d) without exposing the semiconductor substrate to atmospheric air.

8. A method according to claim 1, wherein at least one of said steps (a) and (d) includes a step of forming an oxide film to be performed at an initial stage.

9. A method according to claim 8, wherein said at least one of said steps (a) and (d) further includes a step of nitriding said oxide film formed at the initial stage, to be performed at a succeeding stage.

10. A method according to claim 1, wherein the semiconductor substrate is a silicon substrate, the gate insulating film is a silicon oxide film or a silicon oxynitride film, the native oxide film includes an oxide film formed by at least one chemical process selected from a group consisting of an SPM process, an SC1 process, an SC2 process, and an ozonized water process.

11. A method according to claim 1, wherein said step (c) is done in hydrogen atmosphere at a pressure of 100 torr or lower.

* * * * *